United States Patent [19]

Fujihira

[11] Patent Number: 5,736,774
[45] Date of Patent: Apr. 7, 1998

[54] HIGH VOLTAGE INTEGRATED CIRCUIT, AND HIGH VOLTAGE LEVEL SHIFT UNIT USED FOR THE SAME

[75] Inventor: Tatsuhiko Fujihira, Nagano, Japan

[73] Assignee: Fuji Electric Co., Ltd., Japan

[21] Appl. No.: 670,601

[22] Filed: Jun. 26, 1996

[30] Foreign Application Priority Data

Jun. 28, 1995 [JP] Japan ................................. 7-162139
Oct. 5, 1995 [JP] Japan ................................. 7-258472

[51] Int. Cl.$^6$ ............................ H01L 29/00; H01L 29/76; H01L 29/94
[52] U.S. Cl. ................... 257/500; 257/369; 257/401; 257/501; 257/776
[58] Field of Search ............................ 257/341, 369, 257/374, 401, 500, 501, 776

[56] References Cited

U.S. PATENT DOCUMENTS

| | | |
|---|---|---|
| 4,364,073 | 12/1982 | Becke et al. . |
| 4,399,449 | 8/1983 | Herman et al. . |
| 4,633,292 | 12/1986 | Fellinger et al. . |
| 4,677,325 | 6/1987 | Einzinger et al. ................... 307/574 |
| 4,811,075 | 3/1989 | Eklund . |
| 4,893,165 | 1/1990 | Miller et al. . |
| 4,937,646 | 6/1990 | Tihanyi et al. . |
| 4,947,234 | 8/1990 | Einzinger et al. . |
| 5,008,725 | 4/1991 | Lidow et al. . |
| 5,043,781 | 8/1991 | Nishiura et al. . |
| 5,053,838 | 10/1991 | Fujihira . |
| 5,070,322 | 12/1991 | Fujihira ................................. 340/653 |
| 5,089,871 | 2/1992 | Fujihara . |
| 5,091,664 | 2/1992 | Furuhata ................................. 307/570 |
| 5,097,302 | 3/1992 | Fujihira et al. . |
| 5,159,516 | 10/1992 | Fujihira ................................. 361/18 |
| 5,258,636 | 11/1993 | Rumennik et al. ................... 257/339 |
| 5,287,023 | 2/1994 | Miyasaka ................................. 307/594 |
| 5,304,837 | 4/1994 | Hierold ................................. 257/470 |

Primary Examiner—Ngân V. Ngô
Attorney, Agent, or Firm—Rossi & Associates

[57] ABSTRACT

A high voltage integrated circuit for driving each gate of a power device(s) having one main terminal connected to a high potential side of a high voltage source. The high voltage IC includes a low potential side low voltage circuit portion to which current is supplied by a low voltage source having a reference potential point based on a low potential side of the high voltage source, and a high potential side low voltage circuit portion to which current is supplied by a low voltage source having a reference potential point based on one of the main terminals of the power device. The low potential side low voltage circuit portion is separated from the high potential side low voltage circuit portion, by a loop-shaped high voltage junction terminating structure. A high voltage n-channel transistor for shifting a level of signals from the low potential side low voltage circuit portion for transmission to the high potential side low voltage circuit portion is provided with another loop-shaped high voltage junction terminating structure, such that a drain (collector) electrode is located inside the loop of the junction terminating structure, and source (emitter) and gate (base) electrodes are located outside the loop of the structure. Signal wiring extending from the drain electrode to the high potential side low voltage portion passes over the high voltage junction terminating structures, such that the signal wiring is spaced apart from top surfaces of the junction terminating structures.

23 Claims, 9 Drawing Sheets

HIGH VOLTAGE INTEGRATED CIRCUIT, AND HIGH VOLTAGE LEVEL SHIFT UNIT USED FOR THE SAME

FIELD OF THE INVENTION

The present invention relates to a high voltage integrated circuit used for controlling and driving a power device, and in particular to a high voltage integrated circuit formed on a semiconductor substrate independent of the power device, or on the same semiconductor substrate on which the power device is provided.

BACKGROUND OF THE INVENTION

Numerals denoting footnotes to various references including patents and other documents are provided in the following description of the related prior art. The references cited in the footnotes are listed in the Bibliography section of the specification immediately following Background of the Invention section.

Power devices have been widely used in many applications including inverters or converters for controlling motors, inverters for illumination, various power sources, and switches for driving solenoids and relays[1-4]. The power devices were conventionally driven and controlled by electronic circuits constructed as a combination of individual semiconductor devices and electronic components[5,6]. These functions have been more recently performed by low voltage integrated circuits of several dozens of volts class[7,8] or high voltage integrated circuits of several hundreds of volts[9,10], which utilize recent LSI (large scale integration) technology. Power integrated circuits in which drive and control circuits and power devices are integrated on the same semiconductor substrate are also used to reduce the size of conversion devices, such as inverters and converters, and achieve high operating reliability thereof[11,12].

FIG. 6 is a circuit diagram mainly showing a power-related portion of an inverter for controlling a motor. Power devices (Q1–Q6 as IGBTs—insulated gate bipolar transistor—and D1–D6 as diodes in this example) used for driving a three-phase motor Mo form a bridge circuit, and are all stored in the same package to provide a power module[13]. The main power source $V_{CC}$ usually provides a high voltage of dc 100 to 400 volts. $V_{CCH}$ represents the high-potential side of the main power source $V_{CC}$, and $V_{CCL}$ represents the low-potential side of the main power source $V_{CC}$. To drive IGBTs Q1–Q3 connected to the $V_{CCH}$, the potential of gate electrodes of the IGBTs Q1–Q3 needs to be higher than the $V_{CCH}$. Accordingly, the drive circuit is provided with a photo coupler (PC) or a high voltage integrated circuit (HVIC). The input and output terminals (I/O) of the drive circuit are usually connected to a microcomputer adapted for controlling the inverter as a whole.

FIG. 7 is a block diagram showing constituent units of the high voltage integrated circuit (HVIC) used in the circuit of FIG. 6. This circuit includes a control unit CU, gate drive units GDU and a level shift unit LSU. The control unit sends and receives signals to and from a microcomputer, through the input and output terminals I/O, to generate control signals for turning on and off selected one(s) of the IGBTs. The gate drive units GDU 4–6 receive signals from the control circuit CU through input lines SIN 4–6 and generate signals to output lines OUT 4–6 for driving gates of the corresponding IGBTs. Each of the gate drive units GDU 4–6 also detects excessive current and heat of the IGBT with a current detecting terminal[14] OC 4–6 and a temperature terminal[15] OT 4–6, and generates abnormal signals through a corresponding output line SOUT 4–6. In this manner, the gate drive units GDU 4–6 drive the corresponding IGBT Q4–Q6 connected to the low-potential side $V_{CCL}$ of the main power source $V_{CC}$ of FIG. 6. The gate drive units GDU1–GDU3 perform the same functions as the gate drive units GDU4–GDU6, to drive corresponding IGBT Q1 to Q3 that are connected to the high-potential side $V_{CCH}$ of the main power source $V_{CC}$. The level shift unit LSU functions as an interface between the $V_{CCL}$-level signals of the control circuit CU, and the signals (SIN 1-3, SOUT 1-3) of GDU 1-3 which fluctuate between the $V_{CCH}$ level and the $V_{CCL}$ level. Drive power sources (shown in FIG. 8) $V_{DD1}$–$V_{DD3}$ for the GDU 1–3 have respective high-potential sides $V_{DDH1}$–$V_{DDH3}$ and low-potential sides $V_{DDL1}$–$V_{DDL3}$. The GDU 4–6 are connected to a common drive power source $V_{DDC}$ (not shown in FIG. 8), which has a high-potential side $V_{DDHC}$ and a low-potential side $V_{DDLC}$. The common drive power source $V_{DDC}$ for the GDU 4–6 and CU is about 10 to 20V, and the low-potential side $V_{DDLC}$ of this common power source $V_{DDC}$ is connected to the low-potential side $V_{CCL}$ of the main power source $V_{CC}$ of FIG. 6.

FIG. 8 shows in greater detail the connection between the GDU1 of FIG. 7 and the IGBT Q1, by way of example. The other GDUs and IGBTs are not shown in this figure. The drive power source $VDD_1$ of the GDU1 is about 10 to 20 volts. The low-potential side $V_{DDL1}$ of this power source is connected to an emitter terminal E of IGBT Q1, namely, a U phase of inverter output, and a collector terminal C of the IGBT Q1 is connected to the high-potential side $V_{CCH}$ of the main power source $V_{CC}$. In this arrangement, when the IGBT Q1 is turned on, the potential of $V_{DDL1}$ is made substantially equal to the potential of $V_{CCH}$. When the IGBT Q1 is turned off, the potential of $V_{DDL1}$ is made substantially equal to the potential of $V_{CCL}$. Accordingly, the withstand voltage between the GDU1 and other circuit units needs to be higher than the voltage of the main power source $V_{CC}$. This also applies to GDU2 and GDU3. Further, the level shift unit LSU itself must have high withstand voltage. In FIG. 8, the IGBT Q1 includes a current detecting element[16] M, a temperature detecting element θ, and a temperature detecting terminal[17] Temp. The gate drive unit GDU1 detects abnormal states of the IGBT Q1, through the current detecting terminal OC1 and the temperature detecting terminal OT1, and abnormal signals are generated through the output line SOUT 1. OUT 1 indicates a gate drive terminal.

FIG. 9 is a circuit diagram showing substantially the same circuit as that of FIG. 6, except the use of a product called "intelligent power module"[18]. In this case, the gate drive units GDU1–GDU6 consist of low voltage integrated circuits, individual electronic components and semiconductor devices, and are stored along with power devices (Q1–Q6, D1–D6) in a package containing the power devices. In this case, too, a photo coupler PC or high voltage integrated circuit HVIC is used as an exterior drive circuit.

FIG. 10 shows in detail the vicinity of IGBT Q1 and GDU1 of FIG. 9. SIN1 and SOUT1 are connected to the PC or HVIC provided outside of the power module.

To provide other structures, power IC technology for integrating the GDU1 and Q1 on one chip (on the same semiconductor substrate)[19,20], or power IC technology for integrating all the units of FIG. 9 in one chip[11,12] can be employed.

FIG. 11 is a plan view showing a chip of the high voltage integrated circuit HVIC shown in FIG. 7, to clarify the arrangement of circuit units constituting the circuit. The GDU1 is formed in an island electrically separated from the other circuit units by junction separation[21,22,10] or dielectric separation[23,11,12] to assure high withstand voltage, and the periphery of this GDU1 is surrounded by a high voltage junction terminating structure HVJT[11,12]. The HVJT is a structure of a terminating part of the junction to which high voltage is applied to insulate the unit therein from the other units. Within the level shift unit LSU, there is provided a high voltage n-channel MOSFET (HVN) adapted for shifting a level of signals having the potential $V_{CCL}$ on the low-potential side of the main power source $V_{CC}$, to a level of signals (to be fed to the input line SIN1) having the potential $V_{DDL1}$ on the low-potential side of the drive power source $V_{DD1}$. This high voltage n-channel MOSFET is provided with a high voltage junction terminating structure[10,11] HVJT surrounding a drain electrode $D_N$ at the center of the MOSFET. Within the island of the GDU1, there is provided a high voltage p channel MOSFET (HVP) adapted for shifting the $V_{DDL1}$ level of signals (received from the output line SOUT1), to the $V_{CCL}$ level of signals. This high voltage p-channel MOSFET is also provided with a high voltage junction terminating structure HVJT surrounding a drain electrode $D_P$ at the center of the MOSFET. The input line SIN1 and output line SOUT1 of the GDU1 are installed to extend between GDU1 and LSU, over the high voltage junction terminating structure HVJT. Each of the GDUs is provided with an OUT terminal, OC terminal and OT terminal as shown in FIG. 8. GDU1–GDU3 are provided with respective $V_{DDH1}$–$V_{DDH3}$ terminals, and $V_{DDL1}$–$V_{DDL3}$ terminals, and GDU4–GDU6 are provided with $V_{DDHC}$ terminal and $V_{DDLC}$ terminal. In FIG. 11, the arrangements of these elements of the GDU1 and GDU4 are shown in detail, and those of the other GDUs are not shown.

Problems encountered in the conventional high voltage integrated circuit and power IC include the difficulty in providing high withstand voltage exceeding 600V, and high manufacturing cost. The problems will be described in more detail.

(1) Problems relating to separation techniques

As described above, separation techniques for electrically separating a circuit unit (e.g., GDU 1, 2, 3 shown in FIG. 11) having a greatly different potential from other units include dielectric separation[11,12,23] junction separation[10,21,22] and self separation[20,24]. The structures for enabling dielectric separation and junction separation, however, are complicated, and require high manufacturing cost. The manufacturing cost is further increased with an increase in the withstand voltage required. Although the manufacturing cost can be reduced by employing the self separation, technology has not been developed for achieving high withstand voltage in the structure of CMOS (complimentary MOSFET). In the structure of NMOS (n-channel MOSFET) capable of providing high withstand voltage, it is extremely difficult to achieve sufficiently high accuracy of analog circuits (i.e., the current detecting circuit and temperature detecting circuit as described above).

(2) Problems relating to high voltage junction terminating structure HVJT

Various kinds of high voltage junction terminating structures have been disclosed that include those for vertical power devices[25,26], and those for lateral high voltage devices[27,29]. In the high voltage power IC in which the high voltage integrated circuit and power devices are integrated, however, high voltage junction terminating structures for many applications, such as those (surrounding GDU 1–3 in FIG. 11) formed between integrated circuit units, those (surrounding $D_N$ of HVN in FIG. 11) for high voltage lateral n-channel MOSFETs, those (surrounding $D_P$ of HVP in FIG. 11) for high voltage lateral p-channel MOSFETs, and those for vertical power devices, need to be formed on the same chip. With the conventional high voltage IC or power IC constructed for limited applications, many different kinds of high voltage junction terminating structures HVJT must be formed on the same chip, resulting in increased manufacturing cost.

(3) Problems relating to high voltage junction terminating structure on which wiring is provided In the high voltage IC in which signals travel between integrated circuit units (e.g., GDU1 and LSU of FIG. 11) having greatly different potentials, wiring needs to be provided on the high voltage junction terminating structure HVJT. In this case, however, the high voltage junction terminating structure HVJT may be influenced by the potential of the wiring provided thereon, resulting in reduced withstand voltage of the HVJT[30]. Although various structures have been proposed to solve this problem[10,11,12,31], these structures are complicated, and are only available at high manufacturing cost. Also, these proposed structures are not completely free from the influence of wiring, and is merely able to prevent reduction of the withstand voltage to a limited extent. Thus, the known structures can provide the withstand voltage of up to about 600V, but cannot achieve higher withstand voltage.

It is therefore an object of the present invention to provide a high voltage integrated circuit at a reduced cost, and a high voltage level shift unit used for such a high voltage integrated circuit.

BIBLIOGRAPHY (1) U.S. Pat. No. 4,364,073 (relating to IGBT)
(2) U.S. Pat. No. 4,893,165 (relating to non-punch-through type IGBT)
(3) U.S. Pat. No. 5,008,725 (relating to power MOSFET)
(4) EP 0,071,916 corresponding to JP-A-58-39065 (relating to power MOSFET incorporating high-speed diode)
(5) U.S. Pat. No. 5,091,664 (relating to drive unit)
(6) U.S. Pat. No. 5,287,023 (relating to drive unit)
(7) U.S. Pat. No. 4,947,234 (relating to low voltage IC and power device)
(8) U.S. Pat. No. 4,937,646 (relating to low voltage IC and power device)
(9) A. Wegener and M. Amato "A HIGH VOLTAGE INTERFACE IC FOR HALF-BRIDGE CIRCUITS" Electrochemical Society Extended Abstracts, vol.89-1, pp.476–478 (1989)
(10) T. Terashima et al. "Structure of 600V IC and A New Voltage Sensing Device" IEEE Proceeding of the 5th International Symposium on Power Semiconductor Devices and ICs, pp.224–229 (1993)
(11) K. Endo et al. "A 500V 1A 1-chip Inverter IC with a New Electric Field Reduction Structure" IEEE Proceeding of the 6th International Symposium on Power Semiconductor Devices and ICs, pp.379–383 (1994)
(12) N. Sakurai et al. "A three-phase inverter IC for AC220V with a drastically small chip size and highly intelligent functions" IEEE Proceeding of the 5th International Symposium on Power Semiconductor Devices and ICs, pp.310–315 (1993)
(13) M. Mori et al. "A HIGH POWER IGBT MODULE FOR TRACTION MOTOR DRIVE" IEEE Proceeding of the 5th International Symposium on Power Semiconductor Devices and ICs, pp.287–289 (1993)
(14) U.S. Pat. No. 5,159,516 (relating to current detecting method)
(15) U.S. Pat. No. 5,070,322 (relating to temperature detecting method)

(16) U.S. Pat. No. 5,097,302 (relating to current detecting device)

(17) U.S. Pat. No. 5,304,837 (relating to temperature detecting device)

(18) K. Reinmuth et al. "Intelligent Power Modules for Driving Systems" IEEE Proceeding of the 6th International Symposium on Power Semiconductor Devices and ICs. pp.93–97 (1994)

(19) U.S. Pat. No. 4,677,325 (relating to IPS)

(20) U.S. Pat. No. 5,053,838 (relating to IPS)

(21) R. Zambrano et al. "A New Edge Structure for 2kVolt Power IC Operation" IEEE Proceeding of the 6th International Symposium on Power Semiconductor Devices and ICs. pp.373–378 (1994)

(22) M. F. Chang et al. "Lateral HVIC with 1200-V Bipolar and Field-Effect Devices" IEEE Transactions on Electron devices, vol. ED-33, No.12. pp.1992–2001 (1986)

(23) T. Ohoka et al. "A WAFER BONDED SOI STRUCTURE FOR INTELLIGENT POWER ICs" IEEE Proceeding of the 5th International Symposium on Power Semiconductor Devices and ICs. pp.119–123 (1993)

(24) J. P. MILLER "A VERY HIGH VOLTAGE TECHNOLOGY (up to 1200V) FOR VERTICAL SMART POWER ICs" Electrochemical Society Extended Abstracts, vol.89-1. pp.403–404 (1989)

(25) U.S. Pat. No. 4,399,449 (relating to HVJT for power device)

(26) U.S. Pat. No. 4,633,292 (relating to HVJT for power device)

(27) U.S. Pat. No. 4,811,075 (relating to HVJT for lateral MOSFET)

(28) U.S. Pat. No. 5,258,636 (relating to HVJT for lateral MOSFET)

(29) U.S. Pat. No. 5,089,871 (relating to HVJT for lateral MOSFET)

(30) P. K. T. MOK and C. A. T. SALAMA "Interconnect Induced Breakdown in HVIC's" Electrochemical Society Extended Abstracts, vol.89-1, pp.437–438 (1989)

(31) U.S. Pat. No. 5,043,781 (relating to power IC)

SUMMARY OF THE INVENTION

The above object may be accomplished according a first aspect of the present invention, which provides a high voltage integrated circuit for driving each gate of at least one power device each having main terminals one of which is connected to a high potential side of a high voltage source, and the other of which is connected to a load, comprising: a low potential side low voltage circuit portion to which current is supplied by a low voltage source having a reference potential point based on a low potential side of the high voltage source; a high potential side low voltage circuit portion to which current is supplied by a low voltage source having a reference potential point based on one of the main terminals of each of the at least one power device; a first high voltage junction terminating structure shaped like a loop, for separating the low potential side low voltage circuit portion from the high potential side low voltage circuit portion; a high voltage n-channel transistor for shifting a level of signals from the low potential side low voltage circuit portion for transmission to the high potential side low voltage circuit portion, the high voltage n-channel transistor having a drain (collector) electrode, a source (emitter) electrode, and a gate (base) electrode; a second high voltage junction terminating structure shaped like a loop and provided in the high voltage n-channel transistor, the drain (collector) electrode of the high voltage n-channel transistor being located inside the loop of the second high voltage junction terminating structure, the source (emitter) electrode and the gate (base) electrode being located outside the loop of the second high voltage junction terminating structure; and signal wiring extending from the drain electrode of the high voltage n-channel transistor to the high potential side low voltage portion, passing over the first and second high voltage junction terminating structures, the signal wiring being spaced apart from surfaces of the first and second high voltage junction terminating structures. The high voltage n-channel transistor may preferably consist of a MOSFET. The signal wiring may preferably consist of a bonding wire. It is also preferable that a distance between the signal wiring and one end of the first high voltage junction terminating structure on the side of the low potential side low voltage circuit portion, and a distance between the signal wiring and one end of the second high voltage junction terminating structure on the side of the low potential side low voltage circuit portion are both in a range of 100 µm to 5 mm.

The above object may also accomplished according to a second aspect of the present invention, which provides a high voltage integrated circuit for driving each gate of at least one power device each having main terminals one of which is connected to a high potential side of a high voltage source, and the other of which is connected to a load, comprising: a low potential side low voltage circuit portion to which current is supplied by a low voltage source having a reference potential point based on the low potential side of the high voltage source; a high potential side low voltage circuit portion to which current is supplied by a low voltage source having a reference potential point based on one of the main terminals of each of the at least one power device; a first high voltage junction terminating structure shaped like a loop, for separating the low potential side low voltage circuit portion from the high potential side low voltage circuit portion; a high voltage p-channel transistor for shifting a level of signals from the high potential side low voltage circuit portion for transmission to the low potential side low voltage circuit portion, the high voltage p-channel transistor having a drain (collector) electrode, a source (emitter) electrode, and a gate (base) electrode; a third high voltage junction terminating structure shaped like a loop and provided in the high voltage p-channel transistor, the drain (collector) electrode of the high voltage n-channel transistor being located inside the loop of the second high voltage junction terminating structure, the source (emitter) electrode and the gate (base) electrode being located outside the loop of the second high voltage junction terminating structure; and signal wiring extending from the drain electrode of the high voltage p-channel transistor to the low potential side low voltage portion, passing over the first and second high voltage junction terminating structures, the signal wiring being spaced apart from surfaces of the first and third high voltage junction terminating structures. The high voltage p-channel transistor may preferably consist of a MOSFET. The signal wiring may preferably consist of a bonding wire. It is also preferable that a distance between the signal wiring and one end of the first high voltage junction terminating structure on the side of the high potential side low voltage circuit portion, and a distance between the signal wiring and one end of the third high voltage junction terminating structure on the side of the high potential side low voltage circuit portion are both in a range of 100 µm to 5 mm.

The same object may also be accomplished according to a third aspect of the present invention, which provides a high voltage integrated circuit of hybrid type for driving each gate of at least one power device each having main terminals one of which is connected to a high potential side of a high voltage source, and the other of which is connected to a load, comprising: a high voltage IC chip including a low potential side low voltage circuit portion to which current is supplied by a low voltage source having a reference potential point based on a low potential side of the high voltage source; at least one gate drive IC chip including a high potential side low voltage circuit portion to which current is supplied by a low voltage source having a reference potential point based on a low potential side of one of the main terminals of each of the at least one power device; a high voltage n-channel transistor provided on the side of the high voltage IC chip, for shifting levels of signals from the low potential side low voltage circuit portion for transmission to the high potential side low voltage circuit portion, the high voltage n-channel transistor including a drain (collector) electrode, source (emitter) electrode, and a gate (base) electrode; a second high voltage junction terminating structure shaped like a loop and provided in the high voltage n-channel transistor, the drain (collector) electrode of the high voltage n-channel transistor being located inside the loop of the second high voltage junction terminating structure, the source (emitter) electrode and the gate (base) electrode being located outside the loop of the second high voltage junction terminating structure; and signal wiring extending from the drain electrode of the high voltage n-channel transistor to the high potential side low voltage circuit portion, while passing over the second high voltage junction terminating structure, the signal wiring being spaced apart from a surface of the second high voltage junction terminating structure. The high voltage IC chip and the gate drive IC chip or chips may be formed as individual chips installed on a single printed board. The high voltage n-channel transistor may preferably consist of a MOSFET. The signal wiring may preferably consist of a bonding wire. It is also preferable that a distance between the signal wiring and one end of the second high voltage junction terminating structure on the side of the low potential side low voltage circuit portion is in a range of 100 µm to 5 mm.

The same object may also be accomplished according to a fourth aspect of the present invention, which provides a high voltage integrated circuit of hybrid type for driving each gate of at least one power device each having main terminals one of which is connected to a high potential side of a high voltage source, and the other of which is connected to a load, comprising: a high voltage IC chip including a low potential side low voltage circuit portion to which current is supplied by a low voltage source having a reference potential point based on a low potential side of the high voltage source; at least one gate-driving IC chip including a high potential side low voltage circuit portion to which current is supplied by a low voltage source having a reference potential point based on a low potential side of the of the main terminals of each of the at least one power device; a high voltage p-channel transistor provided on the side of the high voltage IC chip, for shifting levels of signals from the high potential side low voltage circuit portion for transmission to the low potential side low voltage circuit portion, the high voltage p-channel transistor including a drain (collector) electrode, source (emitter) electrode, and a gate (base) electrode; and a third high voltage junction terminating structure shaped like a loop and provided in the high voltage p-channel transistor, the drain (collector) electrode of the high voltage p-channel transistor being located inside the loop of the third high voltage junction terminating structure, the source (emitter) electrode and the gate (base) electrode being located outside the loop of the third high voltage junction terminating structure. The high voltage IC chip and the gate drive IC chip or chips may be formed as individual chips installed on a single printed board. The high voltage IC may further include signal wiring extending from the high potential side low voltage circuit portion to the source (emitter) electrode of the high voltage p-channel transistor, passing over the third high voltage junction terminating structure, the signal wiring being spaced apart from a surface of the high voltage IC chip at the third high voltage junction terminating structure. The high voltage p-channel transistor may preferably consist of a MOSFET. The signal wiring may preferably consist of a bonding wire. It is also preferable that a distance between the signal wiring and one end of the third high voltage junction terminating structure on the side of the high potential side low voltage circuit portion is in a range of 100 µm to 5 mm.

According to the first through fourth aspects of the invention, the distance between the signal wiring and the high voltage junction terminating structure is increased to be more than ten times larger than that of a conventional IC, whereby the space capacity between the wiring and the high voltage junction terminating structure is reduced to be one tenth of that of the conventional counterpart. Accordingly, the degree of reduction of the withstand voltage of the high voltage junction terminating structure due to the wiring is less than one tenth of that of the conventional high voltage IC.

The same object may also be accomplished according to a fifth aspect of the present invention, which provides a high voltage level shift unit included in a high voltage integrated circuit for driving each gate of at least one power device each having main terminals one of which is connected to a high potential side of a high voltage source, and the other of which is connected to a load, the high voltage integrated circuit including a low potential side low voltage circuit portion to which current is supplied by a low voltage source having a reference potential point based on a low potential side of the high voltage source, and a high potential side low voltage circuit portion to which current is supplied by a low voltage source having a reference potential point based on one of the main terminals of each of the at least one power device, the high voltage level shift unit converting a first level of signals received from the low potential side low voltage circuit portion, into a second level of signals to be fed to the high potential side low voltage circuit portion, the high voltage level shift unit comprising: first load means having first and second terminals, and first voltage limiting means having first and second terminals, the first terminals of the first load means and first voltage limiting means being connected to a drain (collector) electrode of a high voltage n-channel transistor, the second terminals of the first load means and first voltage limiting means being connected to a high potential side of the low voltage source of the high potential side low voltage circuit portion; first voltage generating means connected between a source (emitter) electrode of the high voltage n-channel transistor and a low potential side of the low voltage source of the low potential side low voltage circuit portion; and second voltage limiting means connected between a gate (base) electrode of the high voltage n-channel transistor and the low potential side of the low voltage source of the low potential side low voltage circuit portion; and wherein the first level of signals received from the low potential side low voltage circuit portion being entered into the gate (base) electrode of the high voltage n-channel transistor, the second level of signals to be fed to the high potential side low voltage circuit portion being generated from the drain (collector) electrode of the high voltage n-channel transistor. The second voltage limiting means may preferably consist of an n-channel MOS diode connecting the gate (base) electrode and the drain (collector) electrode.

The same object may also be accomplished according to a sixth embodiment of the present invention, which provides a high voltage level shift unit included in a high voltage integrated circuit for driving each gate of at least one power device each having main terminals one of which is connected to a high potential side of a high voltage source, and the other of which is connected to a load, the high voltage integrated circuit including a low potential side low voltage circuit portion to which current is supplied by a low voltage source having a reference potential point based on a low potential side of the high voltage source, and a high potential side low voltage circuit portion to which current is supplied by a low voltage source having a reference potential point based on one of the main terminals of each of the at least one power device, the high voltage level shift unit converting a second level of signals received from the high potential side low voltage circuit portion, into a first level of signals to be fed to the low potential side low voltage circuit portion, the high voltage level shift unit comprising: second load means having first and second terminals, and third voltage limiting means having first and second terminals, the first terminals of the second load means and third voltage limiting means being connected to a drain (collector) electrode of a high voltage p-channel transistor, the second terminals of the second load means and third voltage limiting means being connected to a high potential side of a high voltage source of the low potential side low voltage circuit portion; second voltage generating means connected between a source (emitter) electrode of the high voltage p-channel transistor and the high potential side of the low voltage source of the high potential side low voltage circuit portion; and fourth voltage limiting means connected between a gate (base) electrode of the high voltage p-channel transistor and a high potential side of the low voltage source of the high potential side low voltage circuit portion, and wherein the second level of signals received from the high potential side low voltage circuit portion being entered into the gate (base) electrode of the high voltage p-channel transistor, the first level of signals to be fed to the low potential side low voltage circuit portion being generated from the drain (collector) electrode of the high voltage p-channel transistor. The fourth voltage limiting means may preferably consist of a p-channel MOS diode connecting the gate (base) electrode and the drain (collector) electrode.

According to the fifth and sixth aspects of the present invention, the voltage generated by current flowing through the first or second voltage generating means lowers the voltage between the gate (base) and source (emitter) electrodes of the high voltage n-channel or p-channel transistor, so as to reduce the current flowing through the high voltage n-channel or p-channel transistor. Consequently, the heat generated by the transistor is reduced, assuring high operating reliability.

If the second or fourth voltage limiting means consists of a n-channel or p-channel MOS diode connecting the gate (base) and drain (collector) electrodes, the current flowing through the transistor is further reduced, since the voltage of the MOS diode is lower than that of a Zener diode that is generally used. Thus, the heat generated by the transistor is further reduced, assuring even higher operating reliability.

In the above description, the source, gate and drain electrodes are employed if the high voltage n- or p-channel transistor consists of the MOSFET, and the emitter, base and collector electrodes are employed in the case of other transistors.

In the above-indicated phase that "the high potential side low voltage circuit portion to which current is supplied by a low voltage source having a reference potential point based on one of the main terminals of each power device", the "one of the main terminals" means the terminal connected to the load in the case where the power device on the high potential side is an n-channel device, and means the terminal connected to the power source in the case where the power device is a p-channel device. When the low voltage source has a reference potential point based on one of the main terminals of the power device, the source (emitter) electrode becomes the reference potential point (so-called earth point).

BRIEF DESCRIPTION OF THE DRAWINGS

The invention will be described in greater detail with reference to certain preferred embodiments thereof and the accompanying drawings, wherein.

DETAILED DESCRIPTION OF THE PREFERRED EMBODIMENTS

In the following description, the same symbols or characters as used in the Background of the Invention section will be used for identifying structurally and/or functionally corresponding elements, of which no detailed explanation will not be provided.

Figure 1A:
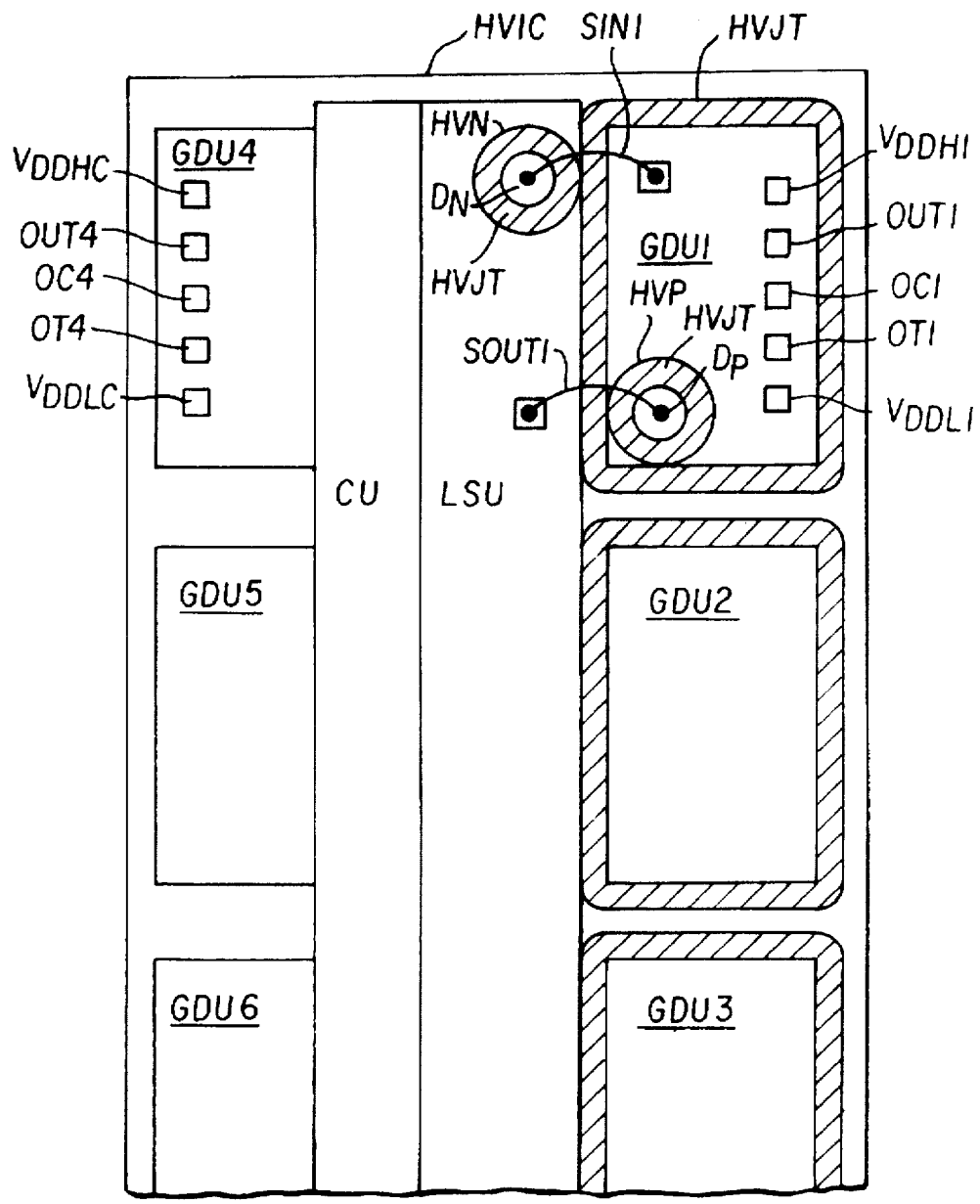
FIG. 1A and FIG. 1B are plan view and side view, respectively, showing the first embodiment of the present invention.
Figure 1B:
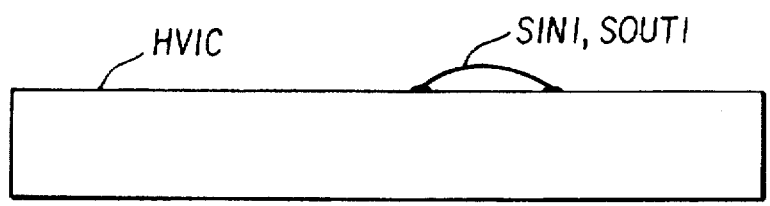

FIGS. 1A and 1B are plan view and side view, respectively, showing a high voltage integrated circuit (HVIC) according to the first embodiment of the present invention. In this high voltage integrated circuit, the high voltage junction terminating structure HVJT is provided for each of the gate drive units GDU1-GDU3 which are high potential side low voltage circuits, high voltage n-channel MOSFET (HVT), and high voltage p-channel MOSFET (HVP). The rain electrode $D_N$ of the high voltage n-channel MOSFET (HVN) and the GDU1, and the drain electrode $D_P$ of the high voltage p-channel MOSFET and the LSU are connected to each other by SIN1 and SOUT1, respectively.

These SIN1 and SOUT1 are formed by bonding wires, such as gold wires. The outer end of each of the high voltage junction terminating structures HVJT for GDU1–GDU3 and the outer end of each of the high voltage junction terminating structures HVJT for HVN, HVP are spaced not less than 100 μm apart from the corresponding bonding wire, whereby the space capacity (floating capacity) can be reduced to one tenth of that of the conventional circuit. Although the space capacity can be reduced with an increase in the spacing between the HVJT and the bonding wire, this spacing is practically not larger than about 5 mm, and usually set at around 1 mm. The above-indicated outer end of the high voltage junction structure HVJT for GDU1–GDU3 and HVN means a point of contact thereof with a low potential side low voltage circuit, and the outer end of the high voltage junction structure HVJT for HVP means a point of contact thereof with the high potential side low voltage circuit.

Figure 2A:
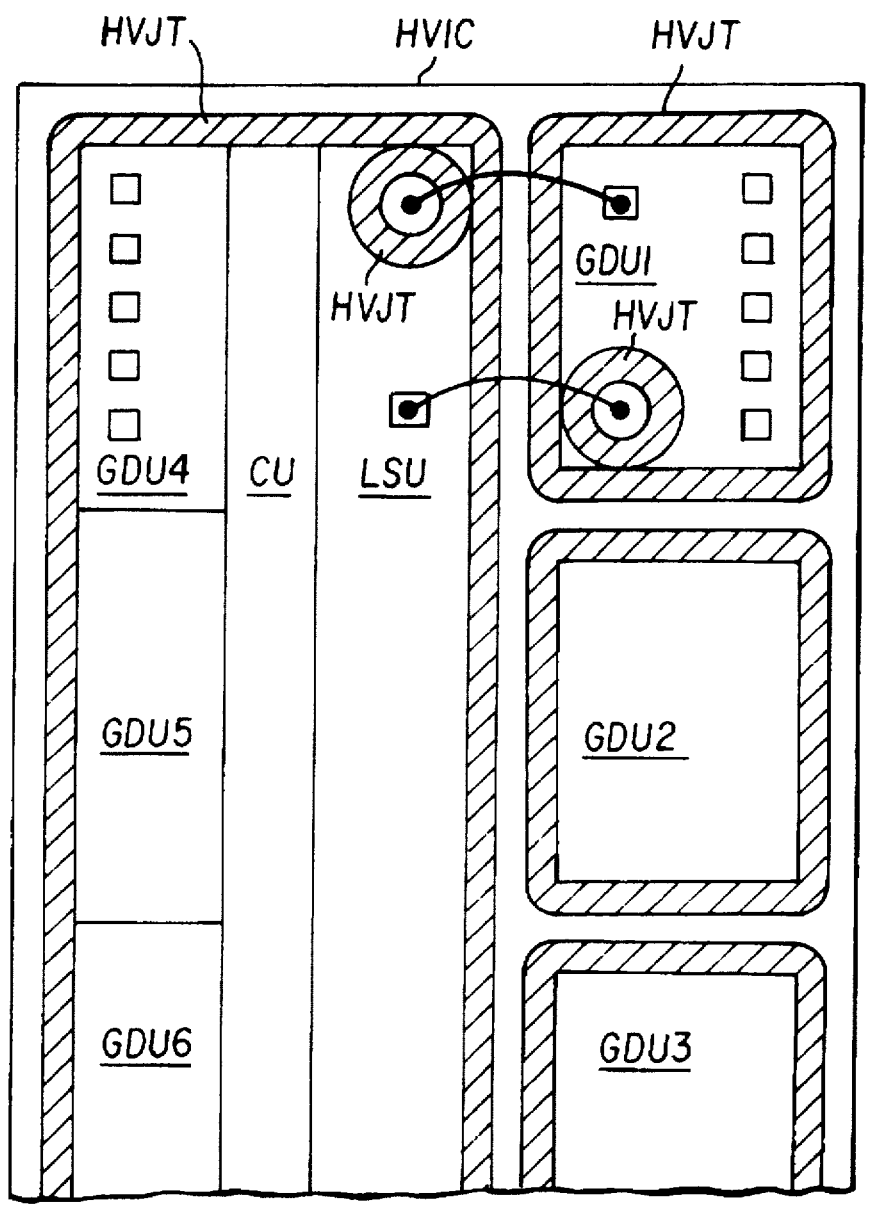
FIG. 2A and FIG. 2B are plan view and side view, respectively, showing the second embodiment of the present invention.
Figure 2B:
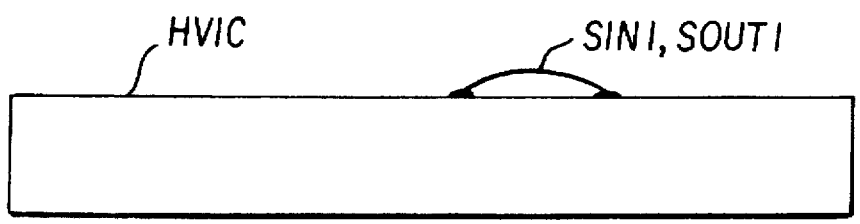

FIGS. 2A and 2A are plan view and side view, respectively, showing the second embodiment of the present invention. In this embodiment, the high voltage junction terminating structure HVJT is provided for each of a low potential side low voltage circuit which consists of the gate drive units GDU4–GDU6, CU and LSU, the gate drive units GDU1–GDU3, the high voltage n-channel MOSFET (HVN), and the high voltage p-channel MOSFET (HVP). The high voltage n-channel MOSFET (HVN) and GDU1, and the high voltage p-channel MOSFET (HVP) and LSU are connected to each other by SIN1 and SOUT1, respectively. These SIN1 and SOUT1 consist of bonding wires, such as gold wires. The outer end of each of the high voltage junction terminating structures HVJT for GDU1–GDU3, and the outer end of each of the high voltage junction terminating structures HVJT for HVN and HVP are spaced not less than 100 μm apart from the corresponding bonding wire, so as to yield the same effects as described above.

Figure 3A:
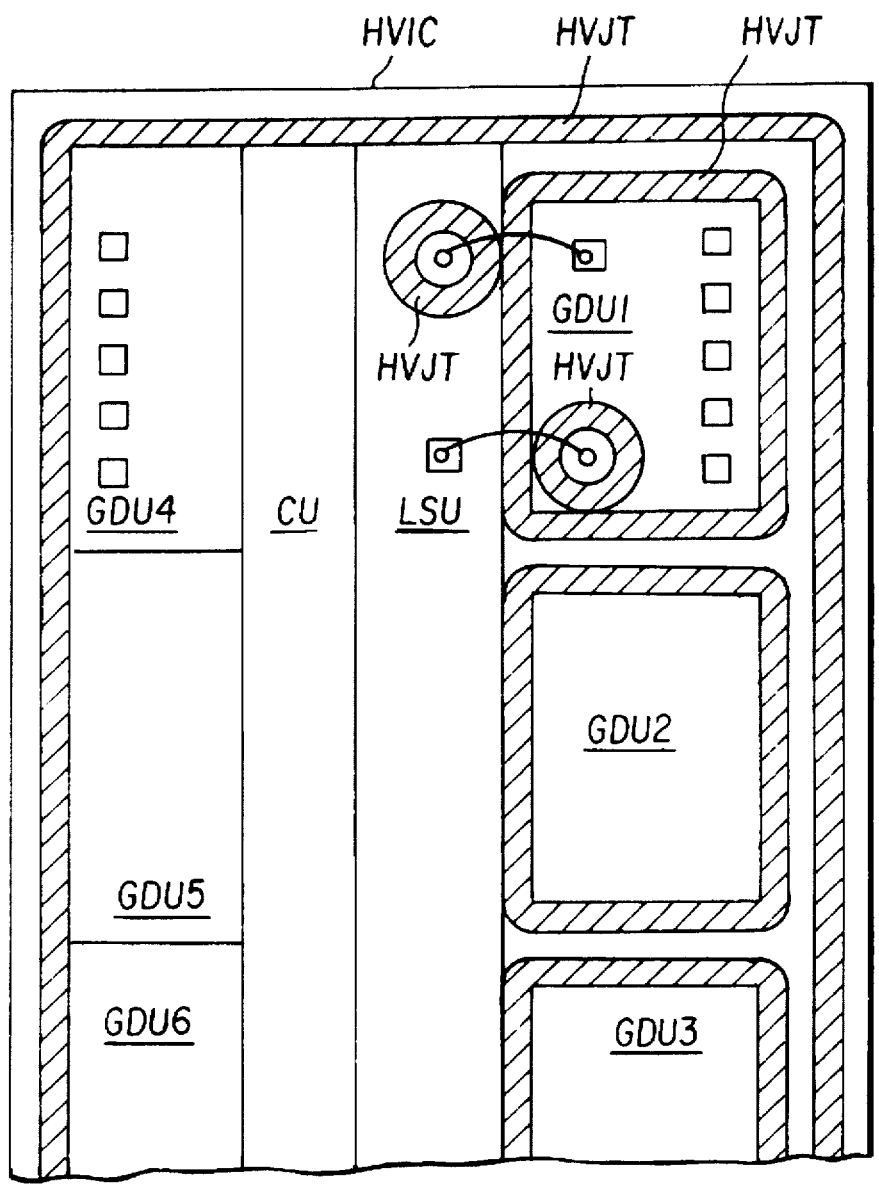
FIG. 3A and FIG. 3B are plan view and side view, respectively, showing the third embodiment of the present invention.
Figure 3B:
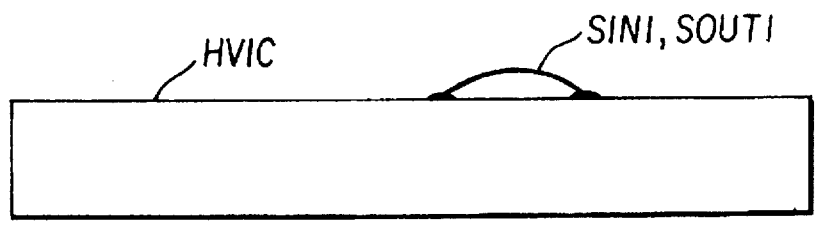

FIGS. 3A and 3B are plan view and side view, respectively, showing the third embodiment of the present invention. In this embodiment, the high voltage junction terminating structure HVJT is provided to surround a chip on which GDU1–GDU6, LSU and CU are formed, and also provided for each of the gate drive units GDU1–GDU3, high voltage n-channel MOSFET (HVN), and high voltage p-channel MOSFET (HVP). The high voltage n-channel MOSFET (HVN) and GDU1, and the high voltage p-channel MOSFET (HVP) and LSU are connected to each other by SIN1 and SOUT1, respectively. These SIN1 and SOUT1 consist of bonding wires, such as gold wires. The outer end of each of the high voltage junction terminating structures HVJT for GDU1–GDU3, and the outer end of each of the high voltage junction terminating structures HVJT for HVN and HVP are spaced not less than 100 μm apart from the corresponding bonding wire, so as to yield the same effects as described above.

Figure 4:
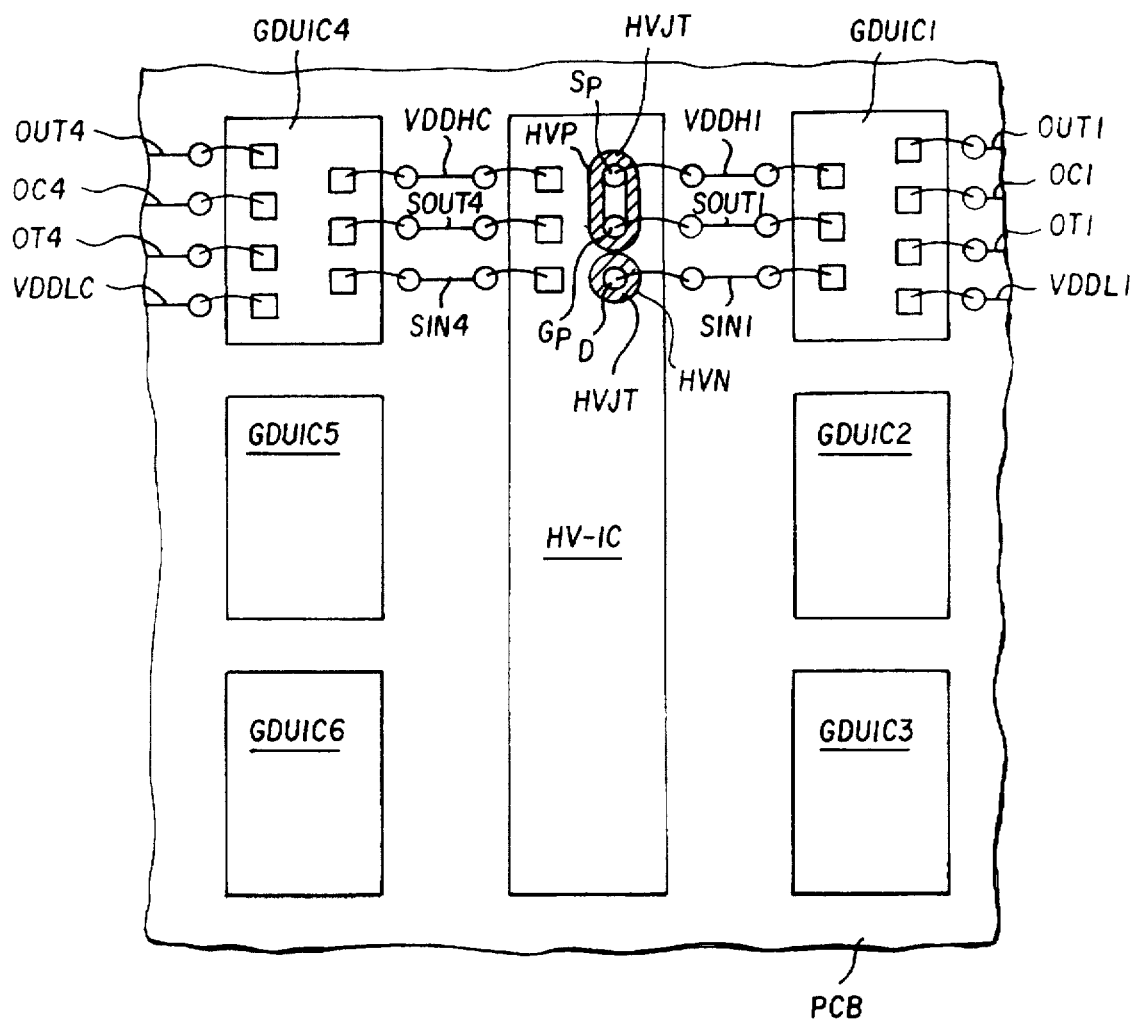
FIG. 4 is a plan view showing the fourth embodiment of the present invention.
Figure 7:
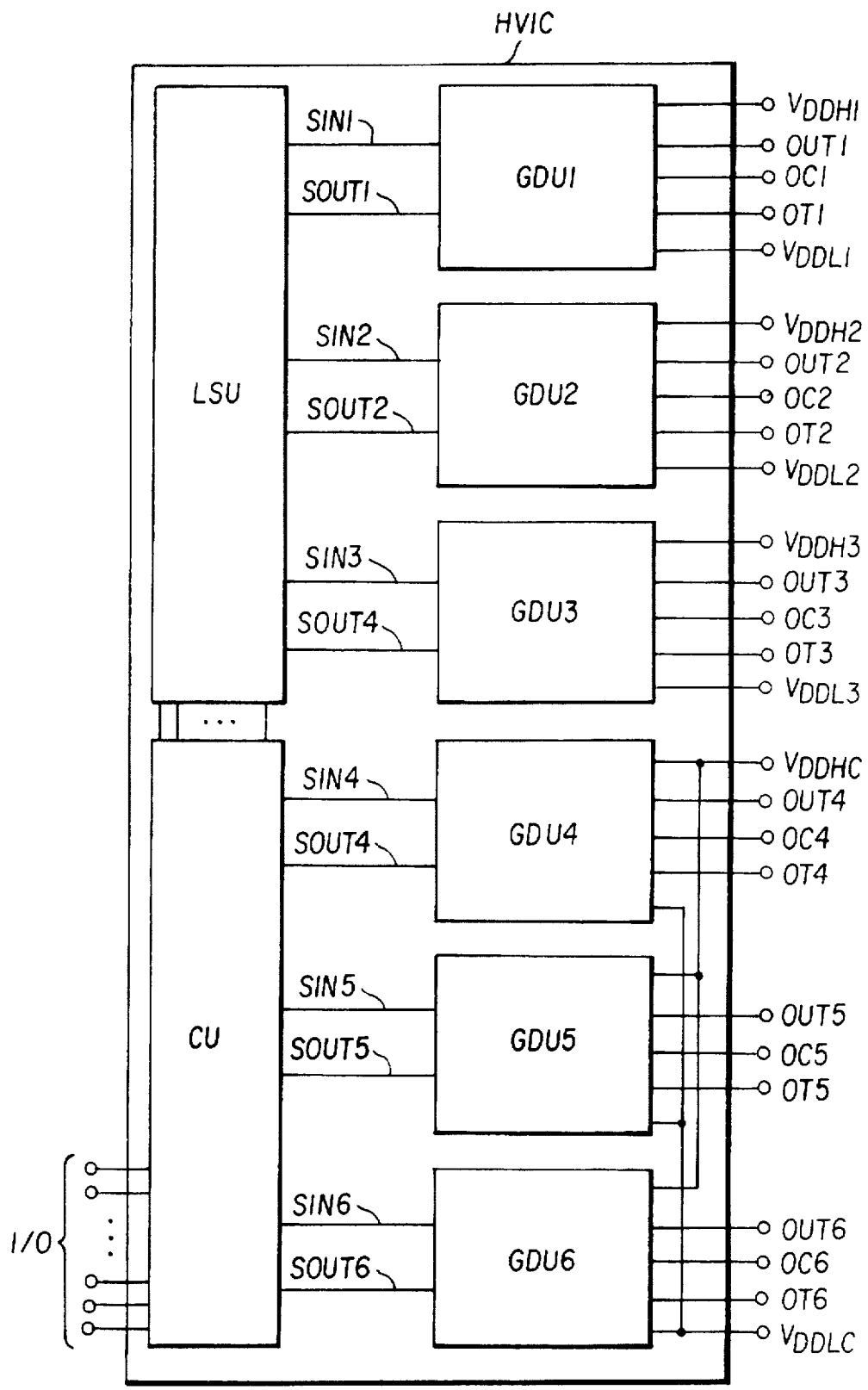
FIG. 7 is a block diagram showing the interior of a high voltage integrated circuit used in the circuit of FIG. 6.
Figure 8:
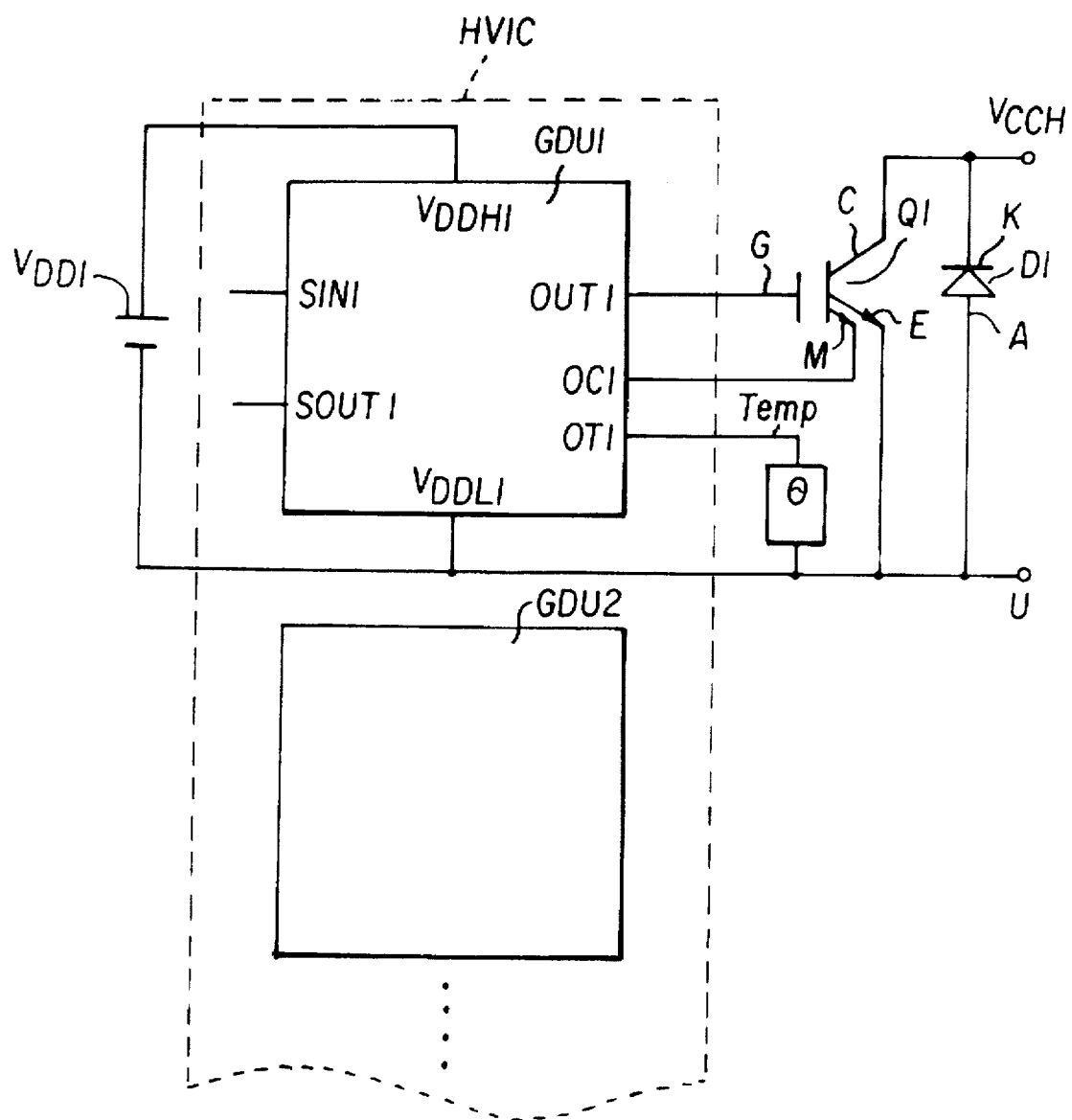
FIG. 8 is a view showing in detail the connection between GDU1 of FIG. 7 and IGBT Q1.
Figure 9:
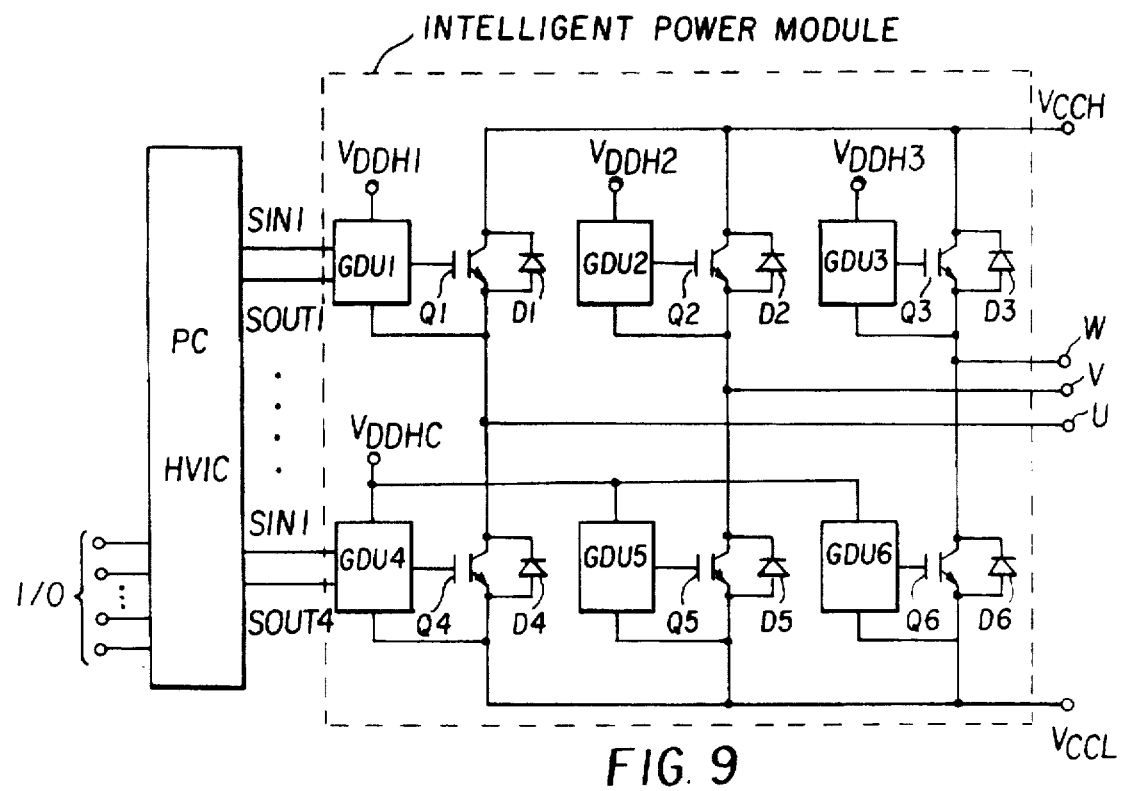
FIG. 9 is a circuit diagram showing a similar circuit to that of FIG. 6, using a product called "intelligent power module"
Figure 10:
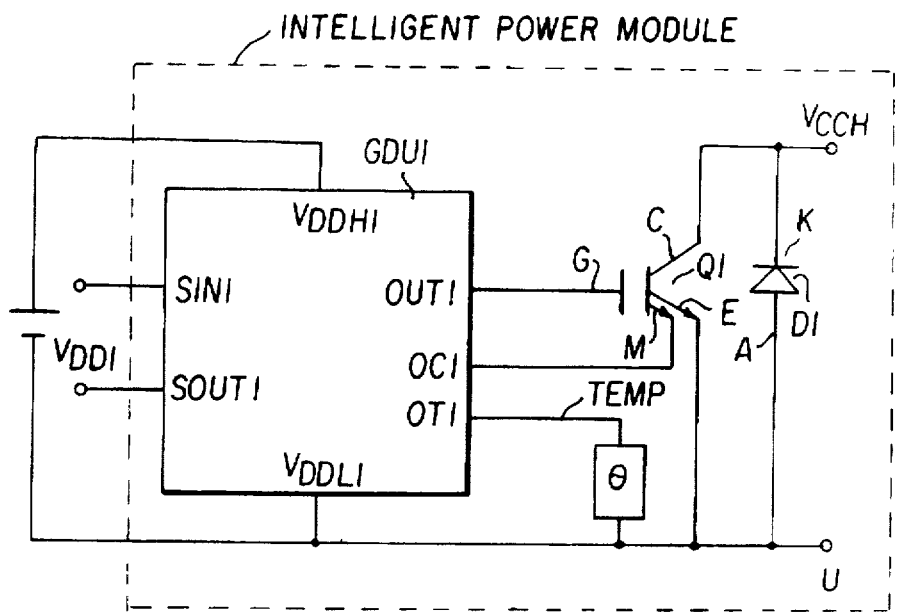
FIG. 10 is a view showing in detail a circuit in the vicinity of the IGBT Q1 and GDU1 of FIG. 9.
Figure 11:
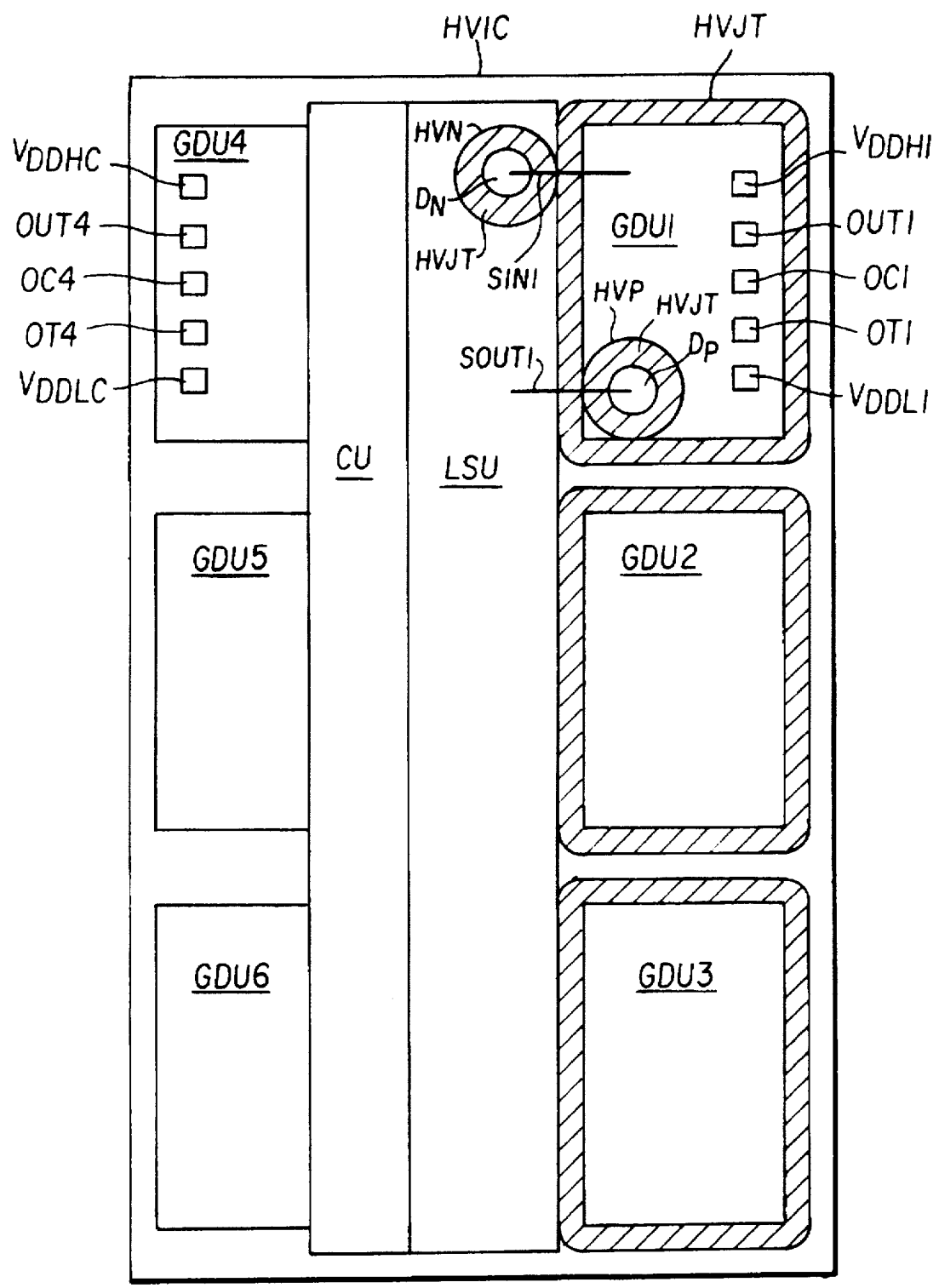
FIG. 11 is a plan view showing a high voltage IC chip as shown in FIG. 7.

FIG. 4 is a plan view of the fourth embodiment of the present invention. In this embodiment, GDUIC1–GDUIC6 that are gate drive units ICs constituting the high voltage integrated circuit of FIG. 7 are produced as individual bare chips, and a high voltage integrated circuit (HV-IC) constituted by the other elements, i.e., HVN, HVP, LSU and CU, is produced as another bare chip. These bare chips are disposed on a printed board PCB. The drain electrode $D_N$ of the high voltage n-channel MOSFET HVN and one end of SIN1 are connected to each other by a bonding wire, and the source electrode $S_P$ and gate electrode $G_P$ of the high voltage p-channel MOSFET HVP are connected to respective ends of $V_{DDH1}$ and SOUT 1 by bonding wires. In FIG. 4, curved lines indicate connections of elements by means of these bonding wires and other bonding wires. The bonding wires are spaced not less than 100 μm apart from the high voltage junction terminating structures HVJT, so that the space capacity is reduced. Needless to say, the bare chips as described above may be assembled together in a package. In another case, the GDUIC1–GDUIC6 formed as individual chips may be incorporated in an intelligent power module (IPM), and a printed board incorporating a high voltage integrate circuit (HV-IC) that excludes the function of the GDUIC1–GDUIC6 is installed on a case of the intelligent power module (IPM).

Figure 5:
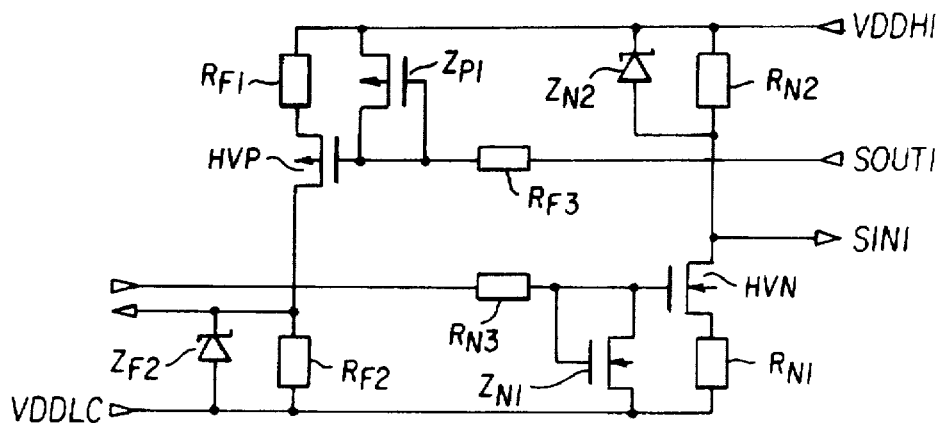
FIG. 5 is a circuit diagram showing a high voltage level shift unit according to the fifth embodiment of the present invention.
Figure 6:
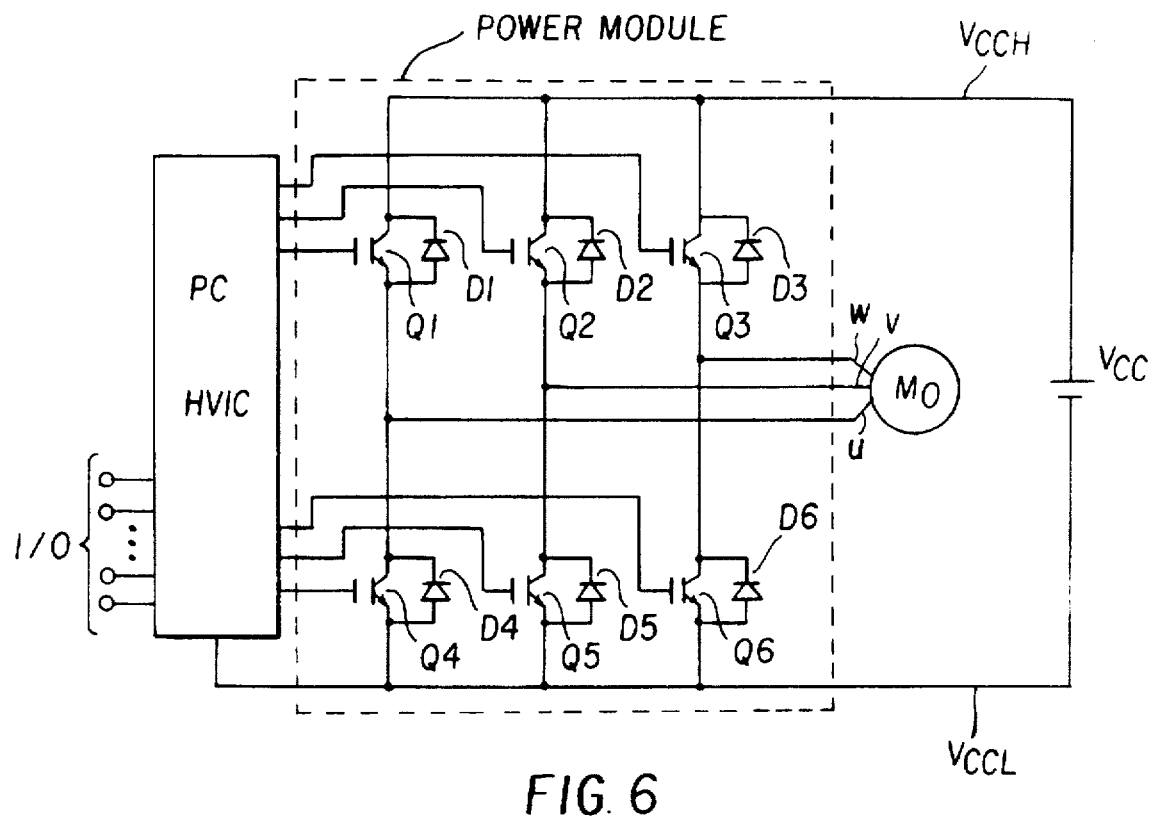
FIG. 6 is a circuit diagram mainly showing a power-related portion of an inverter for controlling a motor.

FIG. 5 shows the fifth embodiment of the present invention. In this embodiment, a resistor or a constant current source provided by a depression-mode MOSFET may be preferably used for $R_{N1}$, $R_{P1}$, $R_{N2}$ and $R_{P2}$ which serve as voltage generating means. While a Zener diode may be employed for $Z_{N1}$, $Z_{P1}$ serving as voltage limiting means, it is more advantageous to employ a MOS diode that is obtained by short-circuiting source and gate electrodes of a MOSFET, so as to achieve a further reduced Zener voltage. While $R_{N3}$, $R_{P3}$ serving as current limiting means are resistors, which are added so as to limit current flowing through $Z_{N1}$, $Z_{P1}$ in the form of MOS diodes, these resistors may not be added if there is no need to limit the current.

In the phrase appearing in the above Summary of the Invention section that "the high potential side low voltage circuit portion to which current is supplied by a low voltage source having a reference potential point based on one of the main terminals of each power device", the "one of the main terminals" means the terminal connected to the load in the case where the power device on the high potential side is an n-channel device, and means the terminal connected to the power source in the case where the power device is a p-channel device. When the low voltage source has a reference potential point based on one of the main terminals of the power device, the source (emitter) electrode becomes the reference potential point (so-called earth point).

While MOSFET is suitably used as the high voltage n-channel or p-channel transistor, JFET (junction type field-effect transistor), bipolar transistor, IGBT (insulated gate bipolor transistor), SIT (static induction transistor), and other transistors may be also used.

While gold wires are used for signal wiring, such as SIN1, SOUT1, in the illustrated embodiments, aluminum wires may also be used. When the signal wiring is spaced not less than 100 μm apart from the side of the high voltage junction terminating structure HVJT on which the potential is greatly different from that of the signal wiring, the potential of the signal wiring has almost no influence on the high voltage junction terminating structure HVJT, causing no electric discharge between the signal wiring and the high voltage junction terminating structure HVJT.

According to the present invention, highly efficient high voltage integrated circuit and high voltage level shift unit can be provided at a reduced cost. Further, a highly efficient drive circuit for a power device can be provided at a reduced cost, using these high voltage IC and level shift unit.

What is claimed is:

1. A high voltage integrated circuit for driving each gate of at least one power device each having main terminals one of which is connected to a high potential side of a high voltage source, and the other of which is connected to a load, comprising:

a low potential side low voltage circuit portion to which current is supplied by a low voltage source having a reference potential point based on a low potential side of the high voltage source;

a high potential side low voltage circuit portion to which current is supplied by a low voltage source having a reference potential point based on one of said main terminals of each of said at least one power device;

a first high voltage junction terminating structure shaped like a loop, for separating said low potential side low voltage circuit portion from said high potential side low voltage circuit portion;

a high voltage n-channel transistor for shifting a level of signals from said low potential side low voltage circuit portion for transmission to said high potential side low voltage circuit portion, said high voltage n-channel transistor having at least one of a drain electrode and a collector electrode, at least one of a source electrode and an emitter electrode, and at least one of a gate electrode and a base electrode;

a second high voltage junction terminating structure shaped like a loop and provided in said high voltage n-channel transistor, said at least one of said drain electrode and said collector electrode of the high voltage n-channel transistor being located inside the loop of the second high voltage junction terminating structure, said at least one of said source electrode and said emitter electrode and said at least one of said gate electrode and said base electrode being located outside the loop of the second high voltage junction terminating structure; and signal wiring extending from said drain electrode of said high voltage n-channel transistor to said high potential side low voltage portion, passing over said first and second high voltage junction terminating structures, said signal wiring being spaced apart from surfaces of said first and second high voltage junction terminating structures.

2. A high voltage integrated circuit as defined in claim 1, wherein said high voltage n-channel transistor consists of a MOSFET.

3. A high voltage integrated circuit as defined in claim 1, wherein said signal wiring consists of a bonding wire.

4. A high voltage integrated circuit as defined in claim 1, wherein a distance between said signal wiring and one end of said first high voltage junction terminating structure on the side of said low potential side low voltage circuit portion, and a distance between the signal wiring and one end of said second high voltage junction terminating structure on the side of the low potential side low voltage circuit portion are both in a range of 100 μm to 5 mm.

5. A high voltage integrated circuit for driving each gate of at least one power device each having main terminals one of which is connected to a high potential side of a high voltage source, and the other of which is connected to a load, comprising:

a low potential side low voltage circuit portion to which current is supplied by a low voltage source having a reference potential point based on a low potential side of the high voltage source;

a high potential side low voltage circuit portion to which current is supplied by a low voltage source having a reference potential point based on one of said main terminals of each of said at least one power device;

a first high voltage junction terminating structure shaped like a loop, for separating said low potential side low voltage circuit portion from said high potential side low voltage circuit portion;

a high voltage p-channel transistor for shifting a level of signals from said high potential side low voltage circuit portion for transmission to said low potential side low voltage circuit portion, said high voltage p-channel transistor having at least one of a drain electrode and a collector electrode, at least one of a source electrode and an emitter electrode, and at least one of a gate electrode and a base electrode;

a third high voltage junction terminating structure shaped like a loop and provided in said high voltage p-channel transistor, said at least one of said drain electrode and said collector electrode of the high voltage n-channel transistor being located inside the loop of the second high voltage junction terminating structure, said at least one of said source electrode and said emitter electrode and said at least one of said gate electrode and said base electrode being located outside the loop of the second high voltage junction terminating structure; and signal wiring extending from said drain electrode of said high voltage p-channel transistor to said low potential side low voltage portion, passing over said first and second high voltage junction terminating structures, said signal wiring being spaced apart from surfaces of said first and third high voltage junction terminating structures.

6. A high voltage integrated circuit as defined in claim 5, wherein said high voltage p-channel transistor consists of a MOSFET.

7. A high voltage integrated circuit as defined in claim 5, wherein said signal wiring consists of a bonding wire.

8. A high voltage integrated circuit as defined in claim 5, wherein a distance between said signal wiring and one end of said first high voltage junction terminating structure on the side of said high potential side low voltage circuit portion, and a distance between the signal wiring and one end of said third high voltage junction terminating structure on the side of the high potential side low voltage circuit portion are both in a range of 100 μm to 5 mm.

9. A high voltage integrated circuit of hybrid type for driving each gate of at least one power device each having main terminals one of which is connected to a high potential side of a high voltage source, and the other of which is connected to a load, comprising:

a high voltage IC chip including a low potential side low voltage circuit portion to which current is supplied by a low voltage source having a reference potential point based on a low potential side of said high voltage source;

at least one gate drive IC chip including a high potential side low voltage circuit portion to which current is supplied by a low voltage source having a reference potential point based on one of said main terminals of each of said at least one power device;

a high voltage n-channel transistor provided on said high voltage IC chip, for shifting levels of signals from said low potential side low voltage circuit portion for transmission to said high potential side low voltage circuit portion, said high voltage n-channel transistor including at least one of a drain electrode and a collector electrode, at least one of a source electrode and an emitter electrode, and at least one of a gate electrode and a base electrode;

a second high voltage junction terminating structure shaped like a loop and provided in said high voltage n-channel transistor, said at least one of said drain electrode and said collector electrode of the high voltage n-channel transistor being located inside the loop of the second high voltage junction terminating structure, said at least one of said source electrode and said emitter electrode and said at least one of said gate electrode and said base electrode being located outside the loop of the second high voltage junction terminating structure; and signal wiring extending from said drain electrode of said high voltage n-channel transistor to said high potential side low voltage circuit portion, while passing over said second high voltage junction terminating structure, said signal wiring being spaced apart from a surface of the second high voltage junction terminating structure.

10. A high voltage integrated circuit as defined in claim 9, wherein said high voltage IC chip and said at least one gate drive IC chip are formed as individual chips installed on a single printed board.

11. A high voltage integrated circuit as defined in claim 9, wherein said high voltage n-channel transistor consists of a MOSFET.

12. A high voltage integrated circuit as defined in claim 9, wherein said signal wiring consists of a bonding wire.

13. A high voltage integrated circuit as defined in claim 9, wherein a distance between said signal wiring and one end of said second high voltage junction terminating structure on the side of said low potential side low voltage circuit portion is in a range of 100 μm to 5 mm.

14. A high voltage integrated circuit of hybrid type for driving each gate of at least one power device each having main terminals one of which is connected to a high potential side of a high voltage source, and the other of which is connected to a load, comprising:

a high voltage IC chip including a low potential side low voltage circuit portion to which current is supplied by a low voltage source having a reference potential point based on a low potential side of said high voltage source;

at least one gate-driving IC chip including a high potential side low voltage circuit portion to which current is supplied by a low voltage source having a reference potential point based on one of said main terminals of each of said at least one power device;

a high voltage p-channel transistor provided on the side of said high voltage IC chip, for shifting levels of signals from said high potential side low voltage circuit portion for transmission to said low potential side low voltage circuit portion, said high voltage p-channel transistor including at least one of a drain electrode and a collector electrode, at least one of a source electrode and an emitter electrode, and at least one of a gate electrode and a base electrode; and a third high voltage junction terminating structure shaped like a loop and provided in said high voltage p-channel transistor, said at least one of said drain electrode and said collector electrode of the high voltage p-channel transistor being located inside the loop of the third high voltage junction terminating structure, said at least one of said source electrode and said emitter electrode and said at least one of said gate electrode and said base electrode being located outside the loop of the third high voltage junction terminating structure.

15. A high voltage integrated circuit as defined in claim 14 wherein said high voltage IC chip and said at least one gate drive IC chip are formed as individual chips installed on a single printed board.

16. A high voltage integrated circuit as defined in claim 14, further comprising signal wiring extending from said high potential side low voltage circuit portion to said at least one of said source electrode and said emitter electrode of said high voltage p-channel transistor, passing over said third high voltage junction terminating structure, said signal wiring being spaced apart from a surface of said high voltage IC chip at said third high voltage junction terminating structure.

17. A high voltage integrated circuit as defined in claim 14, wherein said high voltage p-channel transistor consists of a MOSFET.

18. A high voltage integrated circuit as defined in claim 16, wherein said signal wiring consists of a bonding wire.

19. A high voltage integrated circuit as defined in claim 16, wherein a distance between said signal wiring and one end of said third high voltage junction terminating structure on the side of said high potential side low voltage circuit portion is in a range of 100 μm to 5 mm.

20. A high voltage level shift unit included in a high voltage integrated circuit for driving each gate of at least one power device each having main terminals one of which is connected to a high potential side of a high voltage source, and the other of which is connected to a load, said high voltage integrated circuit including a low potential side low voltage circuit portion to which current is supplied by a low voltage source having a reference potential point based on a low potential side of said high voltage source, and a high potential side low voltage circuit portion to which current is supplied by a low voltage source having a reference potential point based on one of said main terminals of each of said at least one power device, said high voltage level shift unit converting a first level of signals received from said low potential side low voltage circuit portion, into a second level of signals to be fed to said high potential side low voltage circuit portion, said high voltage level shift unit comprising:

first load means having first and second terminals, and first voltage limiting means having first and second terminals, said first terminals of said first load means and first voltage limiting means being connected to at least one of a drain electrode and a collector electrode of a high voltage n-channel transistor, said second terminals of said first load means and first voltage limiting means being connected to a high potential side of said low voltage source of said high potential side low voltage circuit portion;

first voltage generating means connected between at least one of a source electrode and an emitter electrode of said high voltage n-channel transistor and a low potential side of said low voltage source of said low potential side low voltage circuit portion; and second voltage limiting means connected between at least one of a gate electrode and a base electrode of said high voltage n-channel transistor and the low potential side of said low voltage source of said low potential side low voltage circuit portion; and wherein said first level of signals received from said low potential side low voltage circuit portion being entered into said at least one of said gate electrode and said base electrode of said high voltage n-channel transistor, said second level of signals to be fed to said high potential side low voltage circuit portion being generated from said at least one of said drain electrode and said collector electrode of the high voltage n-channel transistor.

21. A high voltage level shift unit as defined in claim 20, wherein said second voltage limiting means consists of an n-channel MOS diode connecting said at least one of said gate electrode and said base electrode and said at least one of said drain electrode and said collector electrode.

22. A high voltage level shift unit of a high voltage integrated circuit for driving each gate of at least one power device each having main terminals one of which is connected to a high potential side of a high voltage source, and the other of which is connected to a load, said high voltage integrated circuit including a low potential side low voltage circuit portion to which current is supplied by a low voltage source having a reference potential point based on a low potential side of said high voltage source, and a high potential side low voltage circuit portion to which current is supplied by a low voltage source having a reference potential point based on one of said main terminals of each of said at least one power device, said high voltage level shift unit converting a second level of signals received from said high potential side low voltage circuit portion, into a first level of signals to be fed to said low potential side low voltage circuit portion, said high voltage level shift unit comprising:

second load means having first and second terminals, and third voltage limiting means having first and second terminals, said first terminals of said second load means and third voltage limiting means being connected to at least one of a drain electrode and a collector electrode of a high voltage p-channel transistor, said second terminals of said second load means and third voltage limiting means being connected to a high potential side of a high voltage source of said low potential side low voltage circuit portion;

second voltage generating means connected between at least one of a source electrode and an emitter electrode of said high voltage p-channel transistor and the high potential side of said low voltage source of said high potential side low voltage circuit portion; and fourth voltage limiting means connected between at least one of a gate electrode and a base electrode of said high voltage p-channel transistor and a high potential side of said low voltage source of said high potential side low voltage circuit portion, and wherein said second level of signals received from said high potential side low voltage circuit portion being entered into said at least one of said gate electrode and said base electrode of said high voltage p-channel transistor, said first level of signals to be fed to said low potential side low voltage circuit portion being generated from said at least one of said drain electrode and said collector electrode of the high voltage p-channel transistor.

23. A high voltage level shift unit as defined in claim 22, wherein said fourth voltage limiting means consists of a p-channel MOS diode with a gate electrode connected to a drain electrode.

* * * * *